(12) United States Patent
Roizin et al.

(10) Patent No.: US 6,703,298 B2
(45) Date of Patent: Mar. 9, 2004

(54) SELF-ALIGNED PROCESS FOR FABRICATING MEMORY CELLS WITH TWO ISOLATED FLOATING GATES

(75) Inventors: Yakov Roizin, Migdal Haemek (IL); Efraim Aloni, Migdal Haemek (IL); Ruth Shima-Edelstein, Migdal Haemek (IL); Christopher Cork, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 10/154,395

(22) Filed: May 23, 2002

(65) Prior Publication Data

US 2003/0218204 A1 Nov. 27, 2003

(51) Int. Cl.[7] ................. H01L 21/3205; H01L 21/8238; H01L 21/425; H01L 29/76
(52) U.S. Cl. ....................... 438/593; 438/201; 438/211; 438/257; 438/514; 438/596; 257/314
(58) Field of Search ................................ 438/201, 211, 438/257, 593, 267, 596; 257/314–326

(56) References Cited

U.S. PATENT DOCUMENTS

| | | | |
|---|---|---|---|
| 5,768,192 A | 6/1998 | Eitan | |
| 5,861,347 A | * 1/1999 | Maiti et al. | 438/787 |
| 6,133,098 A | * 10/2000 | Ogura et al. | 438/267 |
| 6,232,632 B1 | 5/2001 | Liu | |
| 6,242,306 B1 | 6/2001 | Pham et al. | |
| 6,297,093 B1 | * 10/2001 | Borel et al. | 438/257 |
| 6,521,943 B1 | * 2/2003 | Mine et al. | 257/317 |
| 2002/0100926 A1 | * 8/2002 | Kim et al. | 257/296 |

* cited by examiner

Primary Examiner—Carl Whitehead, Jr.
Assistant Examiner—David L. Hogans
(74) Attorney, Agent, or Firm—Bever, Hoffman & Harms, LLP; E. Eric Hoffman

(57) ABSTRACT

A self-aligned process for fabricating a non-volatile memory cell having two isolated floating gates. The process includes forming a gate dielectric layer over a semiconductor substrate. A floating gate layer is then formed over the gate dielectric layer. A disposable layer is formed over the floating gate layer, and patterned to form a disposable mask having a minimum line width. Sidewall spacers are formed adjacent to the disposable mask, and source/drain regions are implanted in the substrate, using the disposable mask and the sidewall spacers as an implant mask. The disposable mask is then removed, and the floating gate layer is etched through the sidewall spacers, thereby forming a pair of floating gate regions. The sidewall spacers are removed, and an oxidation step is performed, thereby forming an oxide region that surrounds the floating gate regions. A control gate is then formed over the oxide region.

12 Claims, 6 Drawing Sheets

US 6,703,298 B2

SELF-ALIGNED PROCESS FOR FABRICATING MEMORY CELLS WITH TWO ISOLATED FLOATING GATES

FIELD OF THE INVENTION

The present invention relates to a self-aligned, scalable non-volatile memory (NVM) cell having two isolated floating gates in a single transistor. The present invention also relates to a method for fabricating such an NVM cell.

RELATED ART

FIG. 1 is a cross sectional view of a dual floating-gate transistor 12. Dual floating-gate transistor 12 includes substrate 16, source/drain regions 14, channel region 20, a pair of polysilicon floating gates 24, bit line oxide regions 19, isolation openings 27, tunnel layer 15, barrier layer 17 and control gate 26. Dual floating-gate transistor 12 is capable of storing two bits of information in a non-volatile manner, one bit in each of the floating gates 24.

A first photoresist mask is used to define the centrally located isolation opening 27, and a second photoresist mask is used to define the adjacent isolation openings 27, thereby isolating the polysilicon floating gates 24. The use of photolithography for dividing the polysilicon floating gates 24 into two sections undesirably limits the possibilities for scaling down the dual floating-gate transistor 12. Moreover, this process undesirably adds two masks to the process flow. Dual floating-gate transistor 12 is more fully described in U.S. Pat. No. 6,242,306 B1, issued to Pham et al.

FIG. 2 is a cross sectional view of a first double-density non-volatile memory cell 42 and a second double-density non-volatile memory cell 42'. This double-density non-volatile memory cell pair includes P-type substrate regions 20A–20C, N+ type source layer 21, which includes source regions 21A–21C, P type channel regions 33, tunnel dielectric layer 34, polysilicon floating gates 35A–35B, P type impurity regions 52, interpoly dielectric layer 60, control gate electrodes 61 having tungsten silicide layer 62 formed thereon, drain regions 63, oxide layer 70, and bit-line through hole 71.

A hard mask (which is likely patterned using a photoresist mask) is used to form the trenches in which the polysilicon floating gates 35A–35B are located. Another photoresist mask is used to form the holes that extend through polysilicon floating gates 35A–35B (i.e., the holes wherein the control gate electrodes 62 are formed). The control gate electrodes 62 are patterned in a conventional manner, which likely includes the formation of another photoresist mask. Bit line through hole 71 is subsequently etched, likely using yet another photoresist mask.

The use of photolithography for dividing the polysilicon floating gates 35A–35B into two sections undesirably limits the possibilities for scaling down the dual floating-gate transistors 42 and 42'. Moreover, this process undesirably uses a relatively large number of masks in the process flow. Double-density non-volatile memory cells 42 and 42' are more fully described in U.S. Pat. No. 6,232,632 B1, issued to Liu.

FIG. 3 is a cross sectional view of another conventional 2-bit non-volatile memory transistor 80. Memory transistor 80, which is fabricated in p-type substrate 82, includes n+ source region 84, n+ drain region 86, channel region 87, silicon oxide layer 88, silicon nitride layer 90, silicon oxide layer 92, and control gate 94. Oxide layer 88, nitride layer 90 and oxide layer 92 are collectively referred to as ONO layer 91. Memory transistor 80 includes a first charge trapping region 96 and a second charge trapping region 98 in silicon nitride layer 90. Memory transistor 80 operates as follows. Charge trapping region 96 is programmed by connecting source region 84 to ground, connecting drain region 86 to a programming voltage of about 5 Volts, and connecting control gate 94 to a voltage of about 10 Volts. As a result, electrons are accelerated from source region 84 to drain region 86. Near drain region 86, some electrons gain sufficient energy to pass through oxide layer 88 and be trapped in charge trapping region 96 of nitride layer 90 in accordance with a phenomenon known as hot electron injection. Because nitride layer 90 is non-conductive, the injected charge remains localized within charge trapping region 96 in nitride layer 90. Charge trapping region 98 is programmed in a reverse manner, by connecting drain region 86 to ground, connecting source region 84 to a programming voltage of about 5 Volts, and connecting control gate 94 to a voltage of about 10 Volts. Again, because nitride layer 90 is non-conductive, the injected charge remains localized within charge trapping region 98 in nitride layer 90.

Charge trapping region 96 of memory transistor 80 is read by applying 0 Volts to drain region 86, 2 Volts to source region 84, and 3 volts to gate electrode 94. If charge is stored in charge trapping region 96 (i.e., memory transistor 80 is programmed), then memory transistor 80 does not conduct current under these conditions. If there is no charge stored in charge trapping region 96 (i.e., memory transistor 80 is erased), then memory cell 80 conducts current under these conditions. Charge trapping region 98 of memory transistor 80 is read in a reverse manner, by applying 0 Volts to source region 84, 2 Volts to drain region 86, and 3 volts to gate electrode 94.

Charge trapping region 96 is erased by applying 0 Volts to gate electrode 94, 8 Volts to drain region 86 and 3 Volts to source region 84. Charge trapping region 98 is erased in a similar manner, by applying 0 Volts to gate electrode 94, 8 Volts to source region 84, and 3 Volts to drain region 86. Memory transistor 80 is described in more detail in U.S. Pat. No. 5,768,192 by Eitan.

During an erase operation of charge trapping region 96, band-to-band tunneling of electrons takes place at the edge of drain region 86. Generated holes are accelerated in the lateral field and are injected into ONO layer 91. The centroid of the injected holes is shifted with respect to the centroid of the shifted electrons (i.e., there is a misalignment of electrons and holes in charge trapping region 96). The holes, which are more mobile in silicon nitride layer 90 than the electrons, can shift laterally in silicon nitride layer. This results in threshold voltage instabilities, wherein the threshold voltage of the erased state increases at room temperature, and wherein the threshold voltage of the programmed state decreases during bakes.

Moreover, scaling of memory transistor 80 is limited due to electron/hole distributions coexisting in silicon nitride layer 90. In the course of cycling (performed during endurance tests), some electrons are trapped far from drain region 86. These electrons are mainly secondary and tertiary electrons created deep in substrate 82. When the electron trapping occurs far from drain region 86, it is difficult to erase the cell because the position of injected holes is fixed. In the erase procedure, the field of these electrons is compensated by the field of the holes. However, the electrons physically remain and influence the second bit. This effect is stronger in short channel devices.

Finally, silicon nitride layer 90 is charged with electrons during the process flow (i.e., plasma charging). The result is an increased level of threshold voltage and threshold voltage spread. The ONO structure 91 cannot be discharged by ultra-violet (UV) irradiation after processing has been completed, because the traps in silicon nitride have extremely low photoionization cross sections. Thus, UV irradiation would cause electrons to be injected into ONO layer 91, thereby undesirably increasing the threshold voltage.

It would therefore be desirable to have a scalable non-volatile memory cell having a pair of isolated floating gates, wherein the non-volatile memory cell can be fabricated without requiring additional masks to be added to a conventional process flow. It would also be desirable to decrease threshold voltage instabilities and improve cycling performance due to hole-electron misalignment and secondary electron effects. It would also be desirable to decrease the initial threshold voltage (VT) spread by providing a threshold voltage initialization option.

SUMMARY

Accordingly, the present invention provides a process for fabricating a self-aligned, scalable NVM transistor having two isolated floating gates in one memory transistor. The process includes forming a gate dielectric layer (e.g., a silicon oxide layer) over a semiconductor substrate. A floating gate layer (e.g., an amorphous silicon or polysilicon layer) is then formed over the gate dielectric layer. A disposable layer is then formed over the floating gate layer. In one embodiment, the disposable layer is a polysilicon layer. In this embodiment, a TEOS layer is formed between the floating gate layer and the polysilicon disposable layer. A first etch step patterns the polysilicon disposable layer to form a disposable mask. In one embodiment, the disposable mask has a width corresponding to the minimum line width of the process being used to fabricate the NVM transistor. The width of the disposable mask defines the minimum channel width of the NVM transistor.

Sidewall spacers are formed adjacent to the disposable mask, and a source/drain implant step is performed, using the disposable mask and the sidewall spacers as an implant mask. As a result, the source/drain regions are formed in the substrate in a self-aligned manner with respect to edges of the sidewall spacers. As described below, the floating gates are formed in a self-aligned manner with respect to the edges of the sidewall spacers. Thus, the source/drain regions are necessarily formed in a self-aligned manner with respect to the edges of the floating gates.

After the source/drain implant has been completed, the disposable mask is removed, thereby leaving the sidewall spacers over the floating gate layer. The floating gate layer is then etched through the sidewall spacers, thereby forming a pair of floating gates under the sidewall spacers. The sidewall spacers are then removed, and an oxidation step is performed. The oxidation step results in the formation of an oxide region, which surrounds and isolates the floating gates. A control gate is then formed over the oxide region.

The present invention advantageously enables the non-volatile memory transistor to be fabricated without requiring substantial modification from a conventional CMOS process flow. The non-volatile memory transistor of the present invention can also be scaled down as the process is scaled down. The split gate nature of the non-volatile memory transistor also reduces threshold voltage instabilities and improves cycling performance by eliminating hole-electron misalignment and secondary electron effects. The non-volatile memory transistor can also be erased by UV irradiation, thereby decreasing the initial threshold voltage ($V_T$) spread.

The present invention will be more fully understood in view of the following description and drawings.

DETAILED DESCRIPTION

FIGS. 4A–4L are cross sectional diagrams illustrating the process steps used to form a 2-bit non-volatile memory transistor 300 having two isolated floating gates in accordance with one embodiment of the present invention. As described below, a pair of dielectric sidewall spacers are used as a mask during a source/drain implant step, whereby the source/drain regions are self-aligned with the sidewall spacers. Moreover, the pair of sidewall spacers are used as a mask during a polysilicon etching step, thereby creating a pair of polysilicon floating gates. In this manner, the polysilicon floating gates are fabricated in a self-aligned manner with respect to the source/drain regions.

Figure 4A:
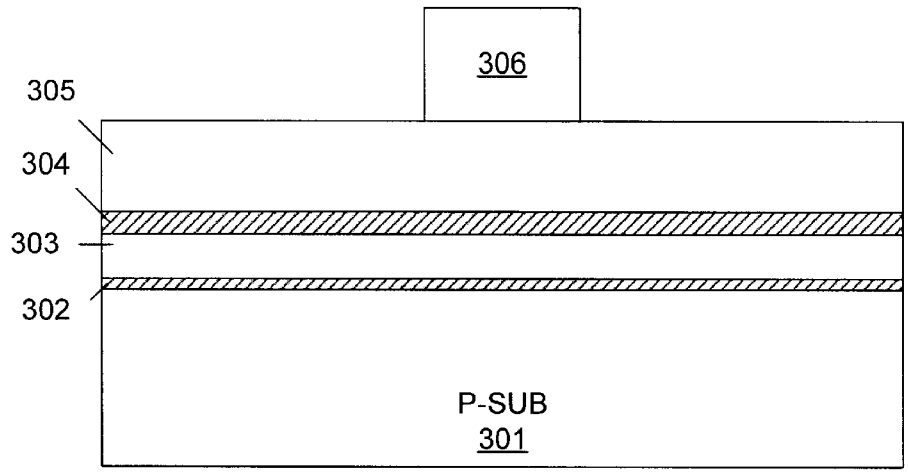
FIGS. 4A–4L are cross sectional diagrams illustrating the fabrication of a non-volatile memory (NVM) transistor having two isolated floating gates in accordance with one embodiment of the present invention.

As illustrated in FIG. 4A, the non-volatile memory transistor is fabricated over a semiconductor substrate 301, which is typically monocrystalline silicon. The described process is a twin-well process. Initially n-wells are formed within substrate 301, followed by p-wells. These well regions are not illustrated for purposes of clarity. However, it is understood that the non-volatile memory transistor is an n-channel device fabricated in a p-well region within substrate 301.

After the n-wells and p-wells have been formed, the required field oxide (not shown) is formed using conventional CMOS processing techniques. It is noted in conventional CMOS processing, after the field oxide is grown, a sacrificial oxide can be grown, and a threshold voltage implant can be performed through the sacrificial oxide. Alternatively, a threshold voltage implant can be performed later in the process.

Returning now to FIG. 4A, after the field oxide has been grown, a gate dielectric layer 302 is deposited or created on the upper surface of substrate 301. In the described embodiment, gate dielectric layer 302 is a layer of silicon oxide having a thickness in the range of about 40 to 250 Angstroms. In the present example, gate dielectric layer 302 has a thickness of approximately 100 Angstroms, created by thermally oxidizing the upper surface of semiconductor substrate 301. It is understood that the thickness of gate dielectric layer 302 will vary based on the process being used to fabricate the non-volatile memory transistor.

A floating gate layer 303 is then deposited on the upper surface of gate dielectric layer 302. In the described embodiment, floating gate layer 303 is formed by depositing a layer of amorphous silicon or polycrystalline silicon at a temperature range between 530 and 650° C. to a thickness in the range of about 150 to 700 Angstroms. In the present example, floating gate layer 303 is amorphous silicon having a thickness of about 400 Angstroms.

A tetra-ethyl ortho-silicate (TEOS) buffer layer 304 is then deposited over the upper surface of floating gate layer 303 using conventional processing techniques. In the described embodiment, TEOS layer 304 has a thickness of about 200 Angstroms. A disposable layer of polycrystalline silicon 305 is then deposited over the upper surface of TEOS layer 304 using conventional processing techniques. In the described embodiment, polysilicon layer 305 has a thickness of about 2000 Angstroms. Together, TEOS layer 304 and polysilicon layer 305 have a thickness in the range of about 1500 to 3000 Angstroms.

A layer of photoresist is then deposited over the upper surface of polysilicon layer 305. This photoresist layer is exposed through a reticle and developed to create photoresist mask 306, as illustrated in FIG. 4A. As will become apparent in view of the following disclosure, photoresist mask 306 helps to define the locations of subsequently formed floating gate regions.

Figure 4B:
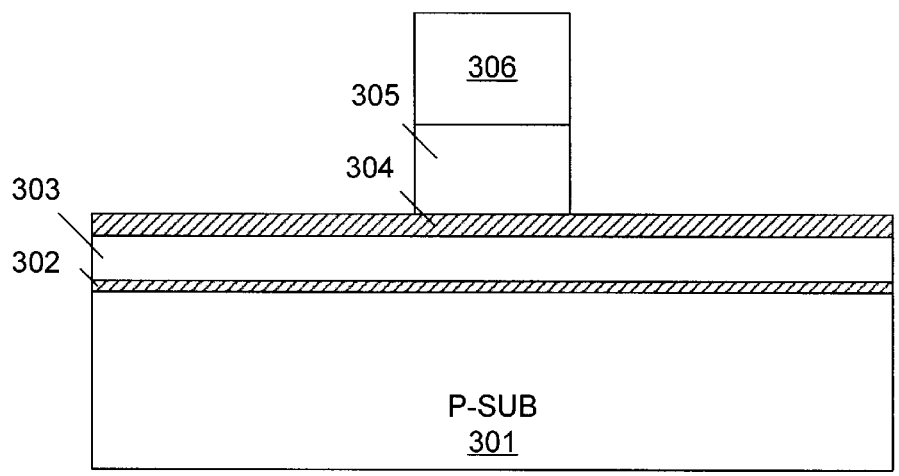

As illustrated in FIG. 4B, polysilicon layer 305 is etched through photoresist mask 306. This etch stopped at TEOS layer 304, thereby leaving disposable polysilicon region 305. Photoresist mask 306 is then stripped.

Figure 4C:
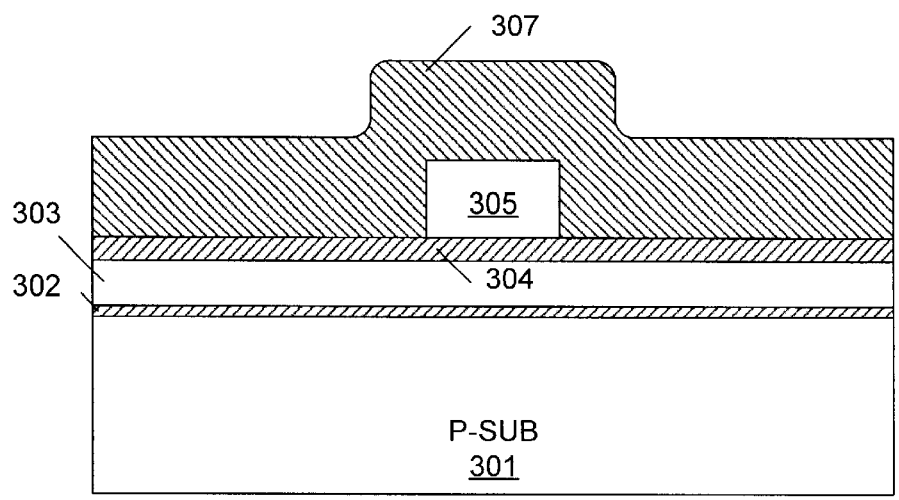

As illustrated in FIG. 4C, a dielectric spacer layer 307 is then deposited over the upper surface of the resulting structure. In the described embodiment, dielectric spacer layer 307 is silicon nitride deposited to a thickness in the range of 1000 to 2500 Angstroms in accordance with conventional CMOS processing techniques. In the present example, dielectric spacer layer 307 is silicon nitride deposited to a thickness of about 1800 Angstroms.

Figure 4D:
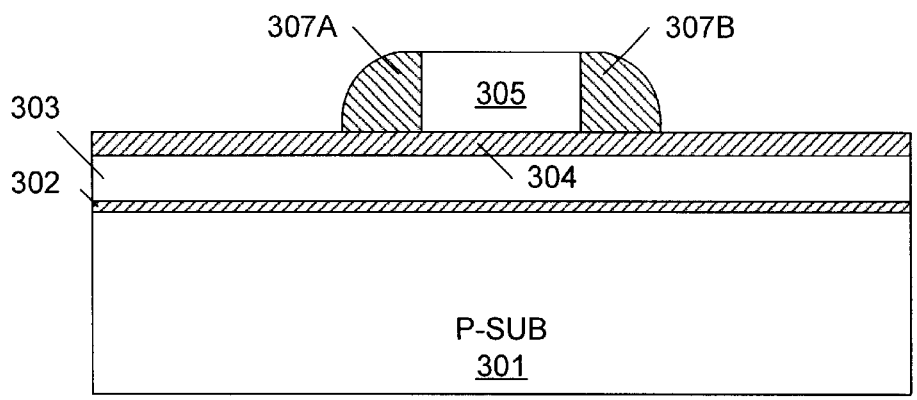

As illustrated in FIG. 4D, dielectric spacer layer 307 is then etched back in accordance with conventional CMOS processing techniques. This etch-back step results in the formation of dielectric sidewall spacers 307A and 307B.

Figure 4E:
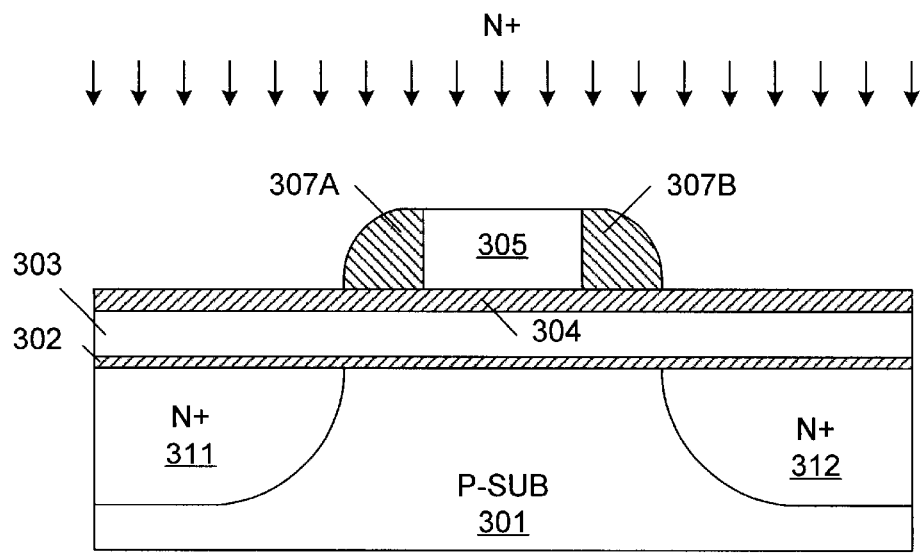

As illustrated in FIG. 4E, a N+ ion implant is performed into the resulting structure. Note that a conventional N+ ion implant mask (not shown) is located over regions where the N+ ion implant is to be excluded. The N+ ion implant step results in the formation of N+ type regions 311 and 312 in p-type substrate 301. As described in more detail below, the impurities in these N+ type regions 311–312 are subsequently activated to form N+ type source/drain regions. These N+ type regions 311 and 312 are self-aligned with the edges of dielectric spacers 307A and 307B, respectively. The N+ type regions 311 and 312 extend to adjacent NVM memory transistors in the same column as the illustrated NVM memory transistor 300. Thus, N+ type regions 311 and 312 form diffusion bit lines in an array of NVM memory transistors. In one embodiment, the N+ ion implant is performed by implanting arsenic at an energy of about 140 KeV and a dosage in the range of 5e13 to 5e15 ions/cm². The N+ ion implant mask is then stripped.

Figure 4F:
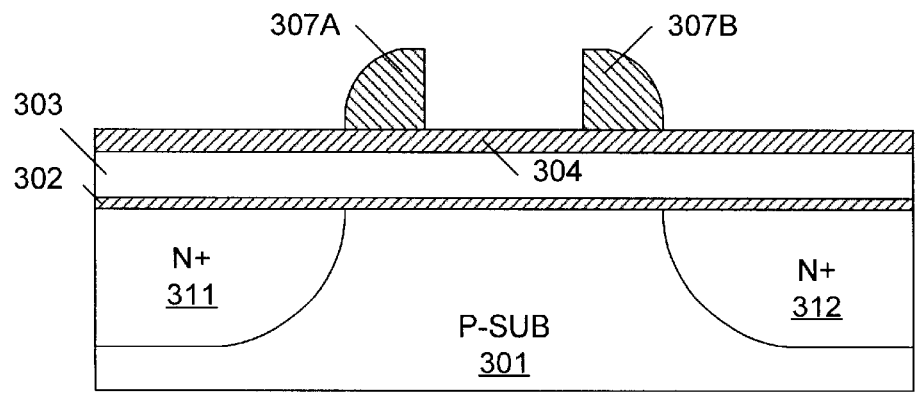

As illustrated in FIG. 4F, a polysilicon dry etch step is then performed, thereby removing the disposable polysilicon region 305. At the end of this dry etch step, nitride spacers 307A–307B remain over TEOS layer 304.

Figure 4G:
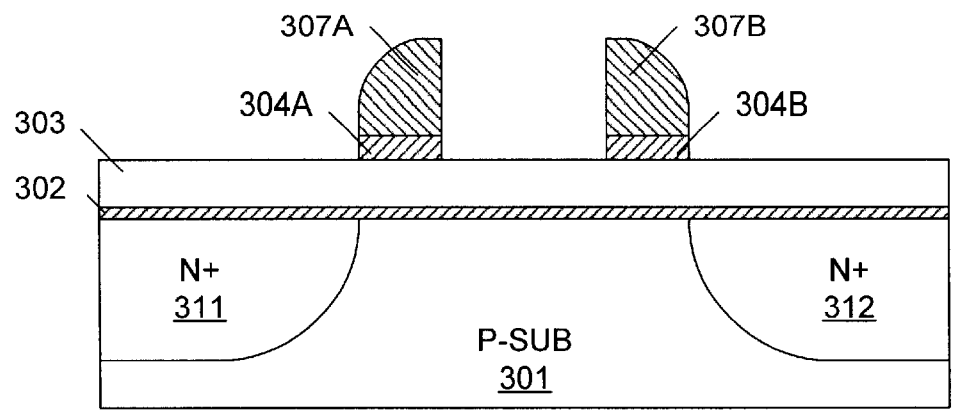

As illustrated in FIG. 4G, a TEOS dry etch step is performed, thereby removing the exposed portions of TEOS layer 304. At the end of this dry etch step, TEOS regions 304A and 304B, which are covered by dielectric spacers 307A and 307B, respectively, remain.

Figure 4H:
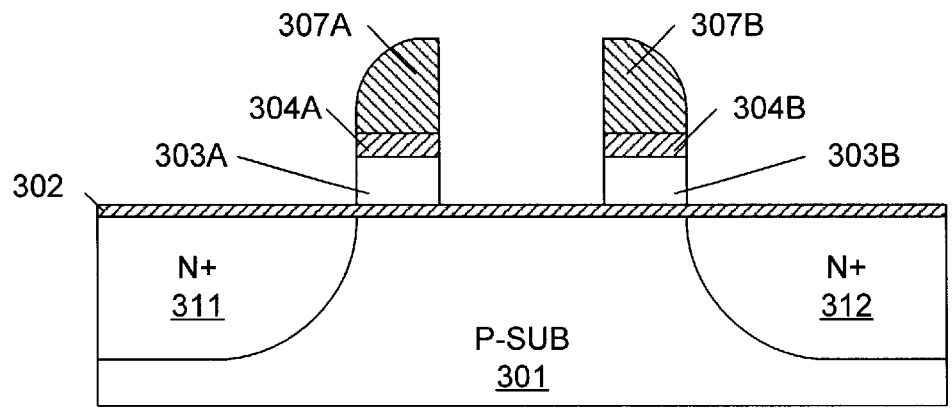

As illustrated in FIG. 4H, a polysilicon dry etch is then performed, thereby removing the exposed portions of polysilicon floating gate layer 303. At the end of this polysilicon dry etch, polysilicon floating gate regions 303A and 303B, which are covered by dielectric spacers 307A and 307B and TEOS regions 304A and 304B, remain.

Figure 4I:
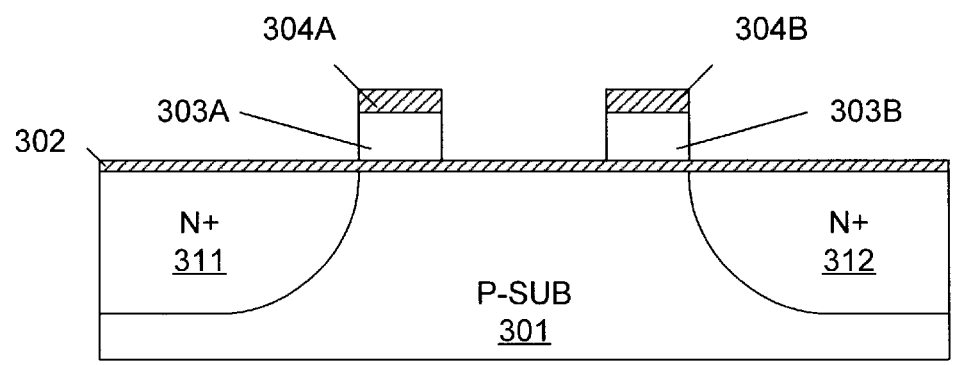

As illustrated in FIG. 4I, a hot $H_3PO_4$ selective nitride etch is performed, thereby removing silicon nitride dielectric spacers 307A and 307B.

Figure 4J:
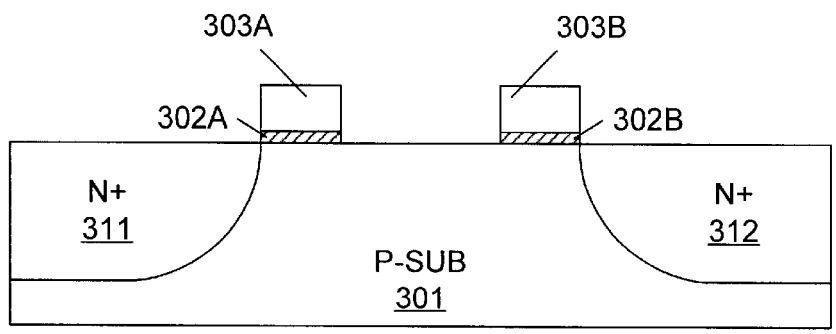

As illustrated in FIG. 4J, a buffered oxide etch (BOE) step is performed, thereby removing the exposed silicon oxide regions. More specifically, the BOE step removes TEOS regions 304A and 304B, and the exposed portions of gate dielectric layer 302. As a result, gate dielectric regions 302A and 302B remain under polysilicon floating gate regions 303A and 303B, respectively.

Figure 4K:
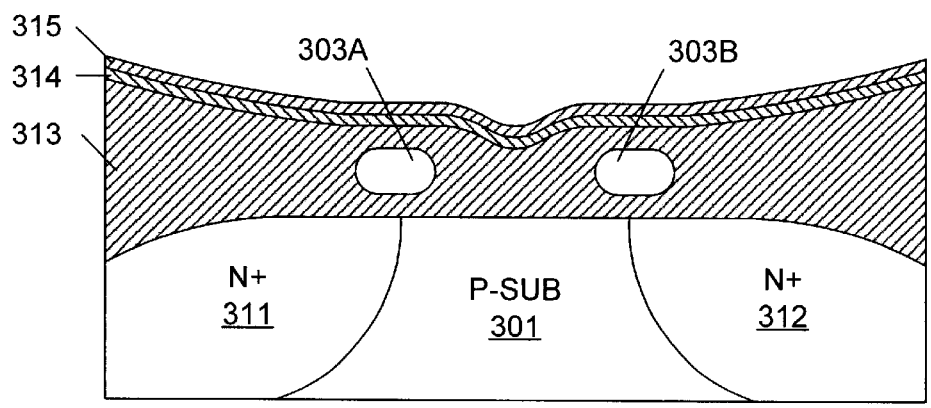

As illustrated in FIG. 4K, an oxidation step is then performed, whereby the polysilicon regions 303A–303B and the substrate 301 are thermally oxidized, thereby forming silicon oxide region 313. Note that polysilicon floating gate regions 303A and 303B and substrate 301 are oxidized about three times slower than the N+ source/drain regions 311 and 312. In one variation, floating gate regions 303A and 303B can be doped with nitrogen in order to suppress the oxidation rate of these regions. In this case, the thickness of silicon oxide region 313 between the two polysilicon floating gate regions and the underlying substrate 301 (i.e., the gate dielectric layer) is greater than the thickness of the silicon oxide region 313 located over the polysilicon floating gate regions. The N+ impurities in regions 311 and 312 are activated during the oxidation step, thereby causing N+ type regions 311 and 312 to diffuse under polysilicon regions 303A and 303B to form source/drain regions of the NVM memory transistor.

In one embodiment, a silicon nitride 314 layer is formed over the thermally grown silicon oxide region 313, and a silicon oxide layer 315 is deposited over the resulting structure using a chemical vapor deposition (CVD) process, thereby forming an oxide-nitride-oxide (ONO) layer over polysilicon floating gate regions 303A and 303B. In an alternate embodiment, silicon nitride layer 314 and silicon oxide layer 315 are not formed.

Figure 4L:
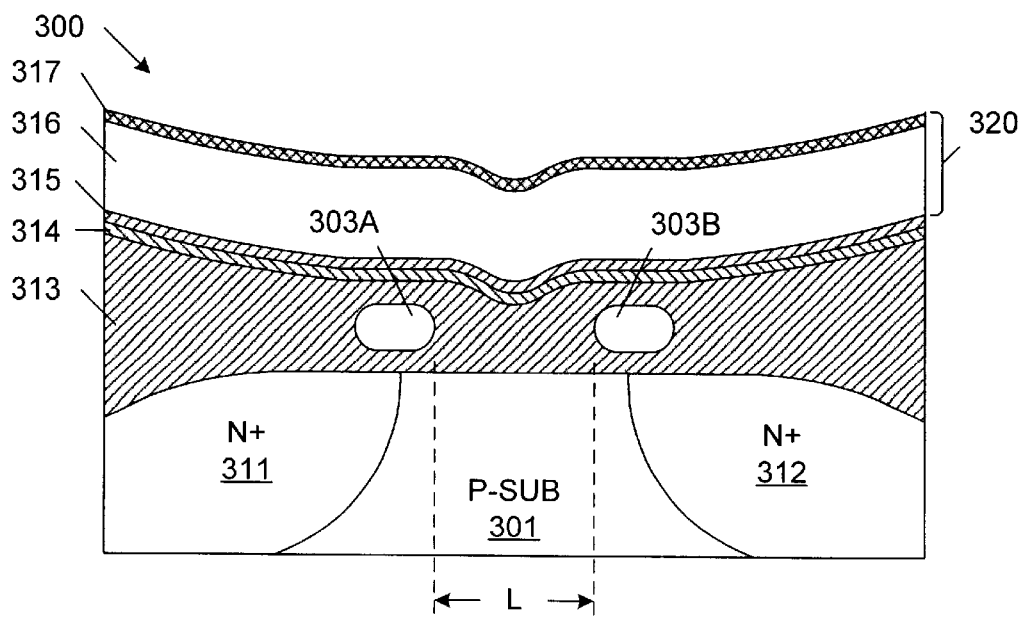

As illustrated in FIG. 4L, a polysilicon layer 316 is fabricated over the resulting structure. A refractory metal layer is deposited over polysilicon layer 316. The refractory metal layer is then caused to react with the underlying polysilicon layer, 316, thereby forming metal silicide layer 317. Polysilicon layer 316 and metal silicide layer 317 combine to form a polycide control gate structure 320.

The structure illustrated in FIG. 4L is a 2-bit split-floating gate non-volatile memory transistor 300. No additional masks need to be added to a conventional CMOS process in order to form memory transistor 300. Misalignment of the source/drain regions and the floating gate regions is not an issue, because the source/drain regions 311 and 312 are formed in a self-aligned manner with respect to the polysilicon floating gate regions 303A–303B, respectfully. Moreover, it is relatively easy to scale down memory transistor 300. This is because as the minimum line width of the process is scaled down, the spacing between the floating gate regions 303A and 303B can be similarly scaled down.

Moreover, the size of each of floating gate regions 303A and 303B are relatively small compared to prior art split gate transistors. Thus, the charge employed in programming and erasing (to reach a certain threshold voltage level) is smaller. As a result, the oxide located under floating gate regions 303A and 303B will be subject to fewer hot electrons and holes during each cycle, thereby increasing the endurance of the memory transistor.

As described above, the polysilicon floating gate regions 303A and 303B are separated in the direction of the source/drain regions 311–312 during the polysilicon etch step illustrated in FIG. 4H. As illustrated in FIG. 4L, polysilicon floating gate regions 303A and 303B are separated by a distance L of about 0.2 microns, when using a 0.18 micron photolithography process.

In accordance with one embodiment of the present invention, non-volatile memory transistor 300 operates as follows to implement read, write and erase operations. Floating gate region 303B is programmed by connecting source/drain region 311 to ground, connecting source/drain region 312 to a programming voltage of about 5 Volts, and connecting control gate 320 to a voltage of about 10 Volts. As a result, electrons are accelerated from source/drain region 311 to source/drain region 312. Near source/drain region 312, some electrons gain sufficient energy to pass through oxide layer 313 and be trapped in floating gate region 303B in accordance with hot electron injection (CHE). The injected charge remains within isolated floating gate region 303B.

Floating gate region 303 is programmed in a similar manner, by connecting source/drain region 312 to ground, connecting source/drain region 311 to a programming voltage of about 5 Volts, and connecting control gate 320 to a voltage of about 10 Volts. The injected charge remains within isolated floating gate region 303A.

Floating gate region 303B of memory transistor 300 is read by applying 0 Volts to source/drain region 312, 2 Volts to source/drain region 311, and 3 volts to gate electrode 320. If charge is stored in floating gate region 303B (i.e., memory transistor 300 is programmed), then memory transistor 300 does not conduct current under these conditions. If there is no charge stored in floating gate region 303B (i.e., memory transistor 300 is erased), then memory transistor 300 conducts current under these conditions. Floating gate region 303A of memory transistor 300 is read in a reverse manner, by applying 0 Volts to source/drain region 311, 2 Volts to source/drain region 312, and 3 volts to gate electrode 320.

Floating gate region 303B is erased by applying 0 Volts to gate electrode 320, 8 Volts to source/drain region 312 and 3 Volts to source/drain region 311. Floating gate region 303A is erased in a similar manner, by applying 0 Volts to gate electrode 320, 8 Volts to source/drain region 311, and 3 Volts to source/drain region 312.

Figure 1:
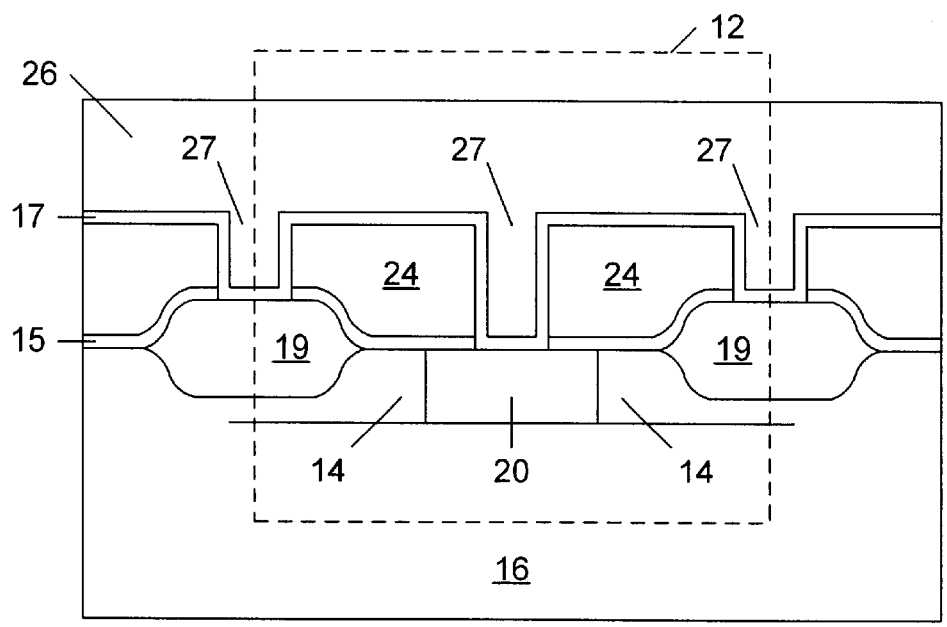
FIG. 1 is a cross sectional diagram of a conventional dual floating-gate transistor.
Figure 2:
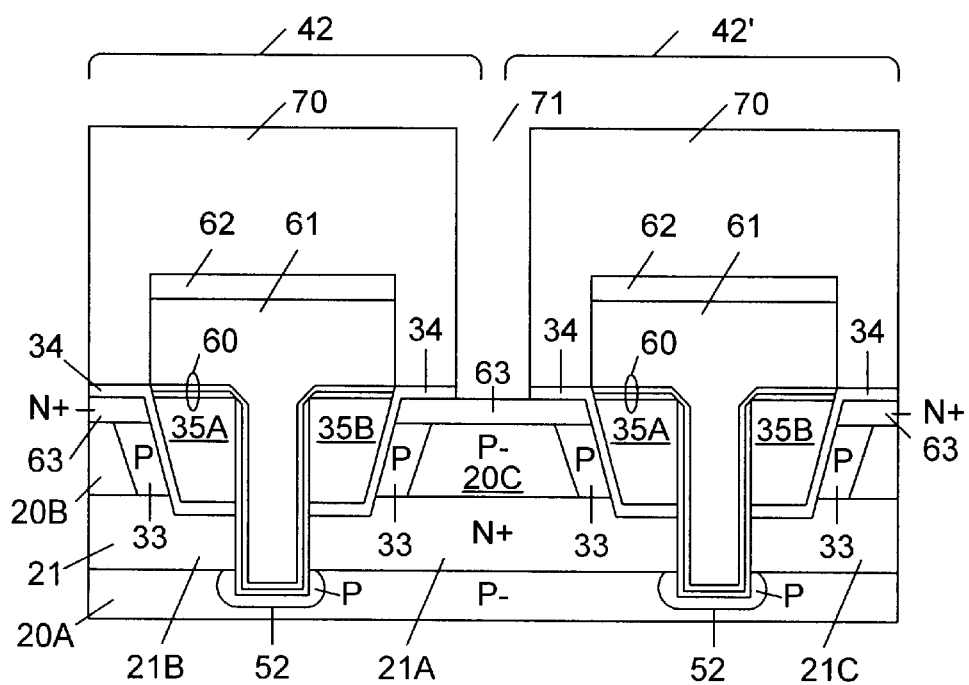
FIG. 2 is a cross sectional diagram of a conventional double-density non-volatile memory cell pair.
Figure 3:
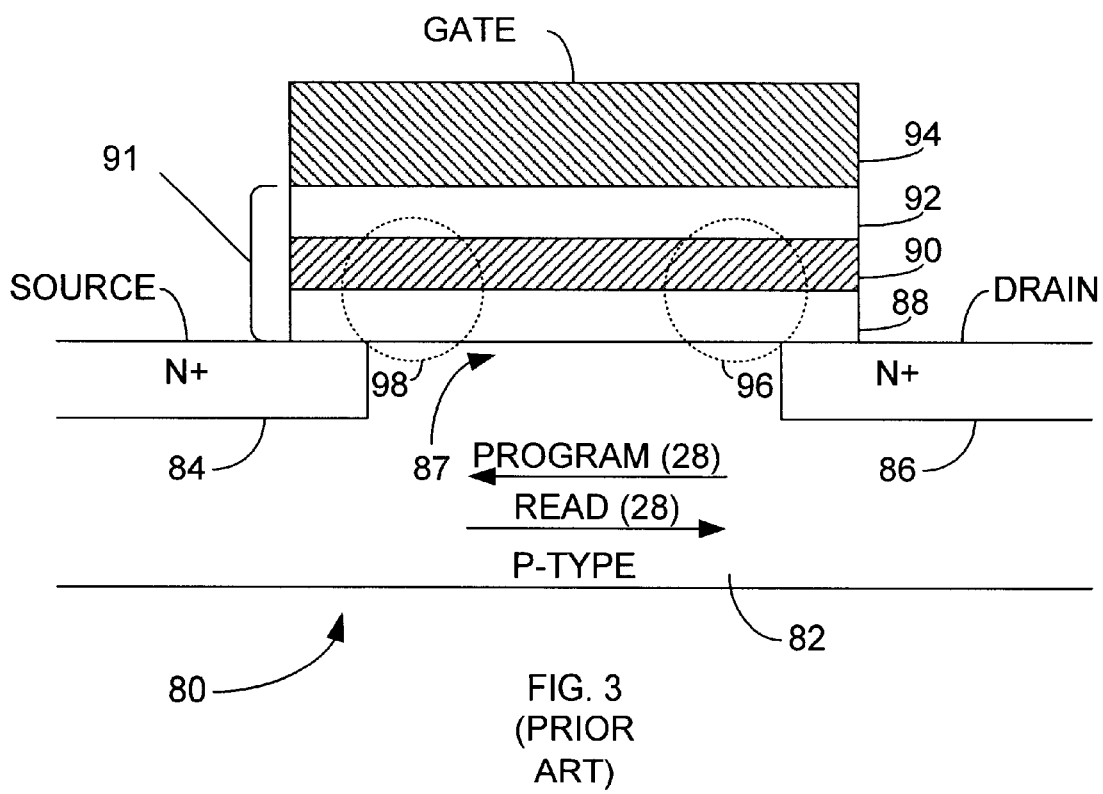
FIG. 3 is a cross sectional diagram of a conventional 2-bit non-volatile memory cell implementing an ONO layer.

The above described process flow results in improved reliability of the non-volatile memory transistor 300 when compared with conventional non-volatile memory transistor 80, which uses a silicon nitride charge trapping layer (FIG. 3). Due to the relatively high conductivity of floating gate regions 303A and 303B, the injection points of electrons and holes are not significant, because the electrons and holes move freely within floating gate regions 303A and 303B and recombine (as in standard EPROM cells). Moreover, the presence of secondary/tertiary electrons during a programming operation can be helpful in memory transistor 300. The secondary/tertiary electrons dominate at lower gate and drain voltages, when compared with hot channel electron (CHE) programming. This allows the operating voltages of memory transistor 300 to be scaled down, and thereby make geometric scaling easier.

Memory transistor 300 also exhibits other device advantages. For example, non-volatile memory transistor 300 can be exposed to ultra-violet (UV) light to perform threshold voltage ($V_T$) initialization, wherein the UV irradiation decreases the initial charge in the floating gates 303A–303B. Moreover, non-volatile memory transistor 300 also enables a Fowler-Nordheim erase option.

Although the invention has been described in connection with several embodiments, it is understood that this invention is not limited to the embodiments disclosed, but is capable of various modifications, which would be apparent to a person skilled in the art. For example, although the invention has been described in connection with an n-channel non-volatile memory transistor, it is understood that the described conductivity types can be reversed to provide a p-channel non-volatile memory transistor. Thus, the invention is limited only by the following claims.

What is claimed is:

1. A method of fabricating a non-volatile memory transistor having two isolated floating gate regions, the method comprising:

forming a gate dielectric layer over a semiconductor substrate;

forming a floating gate layer over the gate dielectric layer;

forming a disposable layer over the floating gate layer;

patterning the disposable layer to form a disposable mask region;

forming a first sidewall spacer and a second sidewall spacer adjacent to the disposable mask region;

implanting source and drain regions in the semiconductor substrate, using the disposable mask region and the first and second sidewall spacers as an implant mask; then removing the disposable mask region; then removing portions of the floating gate layer that are not covered by the first and second sidewall spacers, thereby forming a first floating gate region under the first sidewall spacer, and a second floating gate region under the second sidewall spacer.

2. The method of claim 1, further comprising:

removing the first and second sidewall spacers after the first and second floating gate regions are formed;

performing an oxidation step, whereby an oxide region is grown around and between the first and second floating gate regions; and forming a control gate over the oxide region.

3. The method of claim 2, further comprising doping the first and second floating gate regions with nitrogen prior to the oxidation step.

4. The method of claim 1, wherein the disposable layer comprises polycrystalline silicon.

5. The method of claim 1, further comprising depositing a buffer layer on the floating gate layer, and depositing the disposable layer over the buffer layer.

6. The method of claim 5, wherein the buffer layer comprises disposable tetra-ethyl ortho-silicate (TEOS).

7. The method of claim 6, wherein the disposable layer comprises polycrystalline silicon.

8. The method of claim 1, wherein the step of forming the sidewall spacers comprises:

depositing a dielectric layer over the disposable mask region; and etching back the dielectric layer.

9. The method of claim 8, wherein the step of depositing a dielectric layer comprises depositing silicon nitride over the disposable mask region.

10. The method of claim 1, further comprising selecting the width of the disposable mask region to correspond with a minimum line width of a process being used in the method.

11. The method of claim 1, wherein the floating gate layer is formed by depositing amorphous silicon.

12. The method of claim 1, wherein the floating gate layer is formed by depositing polycrystalline silicon.

* * * * *